United States Patent [19]

Nelson

[11] 4,357,683
[45] Nov. 2, 1982

[54] MAGNETIC BUBBLE MEMORY WITH ION-IMPLANTED LAYER

[75] Inventor: Terence J. Nelson, New Providence, N.J.

[73] Assignee: Bell Telephone Laboratories, Incorporated, Murray Hill, N.J.

[21] Appl. No.: 89,090

[22] Filed: Oct. 29, 1979

[51] Int. Cl.³ .................................... G11C 19/08
[52] U.S. Cl. ............................... 365/36; 365/32
[58] Field of Search ............................. 365/36, 32

[56] References Cited

U.S. PATENT DOCUMENTS 3,792,452  2/1974  Dixon et al. .................. 365/36
3,914,751  10/1975 Keefe et al. .................. 365/36
4,070,658  1/1978  Giess et al. .................. 365/36

OTHER PUBLICATIONS

AIP Conference Proceedings on Magnetism & Magnetic Materials, No. 24, Dec. 3-6, 1974, pp. 624-626.
Journal of Vacuum Science & Technology, vol. 15, No. 5, Sep./Oct. 1978, pp. 1675-1684.

Primary Examiner—James W. Moffitt
Attorney, Agent, or Firm—Herbert M. Shapiro

[57] ABSTRACT

In ion-implanted bubble memories where a patterned ion-implanted layer defines the propagation paths and the special functional elements, a uniform additional ion implant layer provides for a high degree of control over the nucleation level in the bubble material. Design flexibility and high generator margins are achieved.

8 Claims, 3 Drawing Figures

MAGNETIC BUBBLE MEMORY WITH ION-IMPLANTED LAYER

FIELD OF THE INVENTION

This invention relates to magnetic bubble memories and, more particularly to ion-implanted magnetic bubble memories in which magnetic bubbles follow paths defined by a pattern of ion-implanted regions.

BACKGROUND OF THE INVENTION

U.S. Pat. No. 3,460,116 of A. H. Bobeck, U. F. Gianola, R. C. Sherwood, and W. Shockley; issued Aug. 5, 1969, discloses a magnetic bubble memory known as a "current-access" bubble memory. In a current access memory, bubbles are moved along paths defined by current carrying electrical conductors which produce a pattern of magnetic field gradients for effecting bubble movement in response to a succession of current pulses.

U.S. Pat. No. 3,618,051 of P. I. Bonyhard, U. F. Gianola, and A. J. Perneski; issued Nov. 2, 1971 describes a "field access" mode of operating bubble memories. A memory operating in the field-access mode utilizes a uniform magnetic field which rotates in the plane of bubble movement. The memory includes a periodic pattern of magnetically soft elements which align with the rotating field at varying orientations. Due to both the shapes of the elements and the succession of orientations, a succession of field gradients again are generated along a path and bubble movement occurs.

As is well known in the art, a field-access mode bubble memory employs permalloy to define a typical pattern of elements. However, alternatives are known. Such alternatives include grooves, mesas, and ion-implanted regions. The use of ion-implanted regions to produce bubble movement is disclosed in U.S. Pat. No. 3,792,452 of M. Dixon, R. A. Moline, J. C. North, L. J. Varnerin Jr., and R. Wolfe, issued Feb. 12, 1974.

As is further known in the art, a uniform ion implanted layer may be employed, along with permalloy propagation elements in a field-access mode magnetic bubble memory to suppress the formation of "hard bubbles." However, in a field-access magnetic bubble memory using a pattern of ion-implanted regions to produce bubble movement, no uniform ion-implanted layer is employed because bubbles in such circuits remain under the ion-implanted regions of the patterned layer. Hard bubble suppression by additional implantation in such circuits is superfluous.

It has been found difficult to make magnetic bubble generators with commercially acceptable characteristics combined with propagation elements formed by ion implantation. That is to say, magnetic bubble generators which utilized ion-implanted regions rather than permalloy typically generate bubbles in response to very low generator currents. In fact, generation occurs at such low currents that spurious bubbles appear in unwanted positions leading to low operating margins for current-controlled functions other than generation. Further, the propagation path may nucleate by itself leading to a loss of propagation margins.

BRIEF DESCRIPTION OF THE INVENTION

The problems of low margins characteristic of magnetic bubble generators in ion-implanted memories is resolved herein by the inclusion of an uniform ion-implanted layer in addition to a patterned implant layer to achieve generator geometries. The resulting generators are characterized by a surprising improvement in operating margins.

A generator herein is characterized illustratively by an ion-implanted pattern with one region having a periodic (viz a sinusoidal) edge and a spaced apart second region. The two regions of the patterned layer are separated by a nonimplanted region. An additional uniform implanted layer occupies the entire surface area of the memory in one embodiment. An electrical conductor extends between neighboring implanted regions of the patterned layer and the intervening "nonimplanted" region. It is to be understood that the uniform layer may be subterranean with like result herein and may also occupy an area less than the entire surface area of the chip but large compared to the period of the patterned implanted layer.

DETAILED DESCRIPTION

Figure 1:
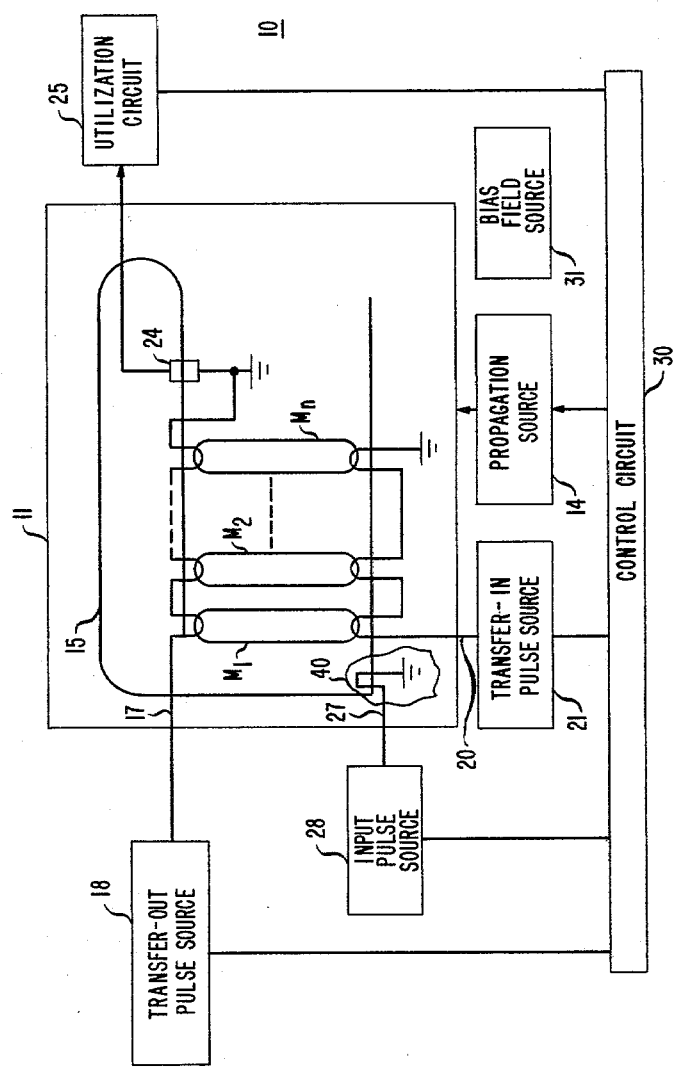
FIG. 1 is a block diagram of a bubble memory in accordance with this invention.

FIG. 1 shows a magnetic bubble memory 10 including a host layer 11 of magnetic material in which magnetic bubbles can be moved. Layer 11 includes a patterned ion-implanted layer 13 of FIG. 2 which defines a plurality of paths for bubble movement in layer 11. These paths are organized, illustratively, in a familiar major minor mode. Bubbles recirculate about closed loop minor paths $M_1$, $M_2$—$M_n$ in response to a magnetic field, illustratively, rotating in the plane of layer 11. The rotating magnetic field is generated by a propagation source represented by block 14.

Bubble patterns are moved to and from the minor loops at first and second ends of the loops which come into close proximity to a major line 15. Line 15 is shown in a familiar G-shaped configuration as is clear from an inspection of FIG. 1. The bubbles are moved out of the loops at a first end in response to a transfer-out pulse applied to electrical conductor 17 by a transfer-out pulse source represented by block 18. Bubbles are transferred into the loops at a second end similarly by a pulse applied to electrical conductor 20 by a transfer-in pulse source represented by block 21.

A pattern of bubbles transferred out at the first end of the minor loops advances to the right as viewed in FIG. 1 in response to the rotating field to generate a signal in detector 24. The signal is applied to a utilization circuit represented by block 25.

A bubble pattern is generated by a sequence of generated pulses applied to electrical conductor 27 by an input pulse source 28. Bubbles so generated are moved to the right, as viewed, for transfer into the minor loops at the second ends of the minor loops.

A control circuit represented by block 30 controls the various operations of the memory synchronizing the generator, detector, and transfer operations with the rotating field. Control circuits operative in such a manner are well known in the art. A bias field source represented by block 31 supplies the familiar bias field for bubble operation.

The invention herein is directed at a magnetic bubble memory with a unique configuration of ion-implanted layers and the improvement in generator margins because of the relationship between the ion-implanted layers. Accordingly, attention is directed to FIG. 2 where the generator portion 40 of the memory of FIG. 1 is shown enlarged.

Figure 2:
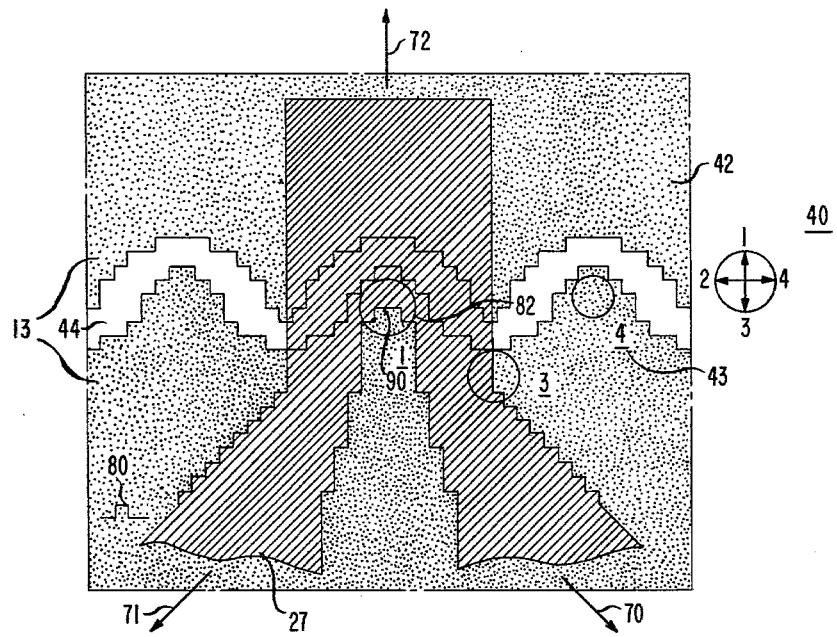
FIGS. 2 and 3 are schematic illustrations of top and cross-sectional views of portions of the memory of FIG. 1.

FIG. 2 shows conductor 27 of FIG. 1 overlying two ion-implanted regions 42 and 43 separated by a nonimplanted region 44. The term "nonimplanted" herein refers to a region of the patterned ion-implanted layer which region is not implanted. It is to be understood that layer 11 includes an unpatterned ion-implanted layer over at least a portion large compared to the period of the propagation pattern, i.e., the period of the sinusoidal pattern of nonimplanted region 44.

Figure 3:
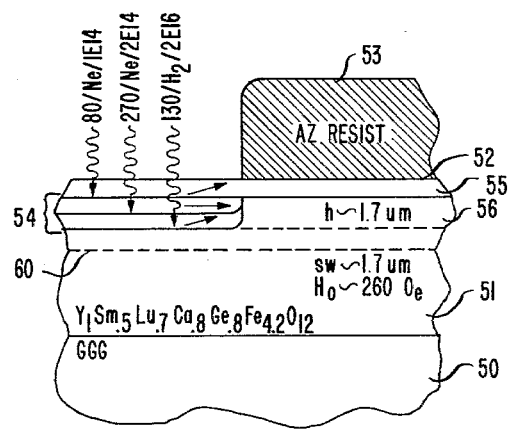

The designation of patterned and unpatterned ion-implanted regions is, perhaps, better understood in connection with FIG. 3. FIG. 3 shows a representative cross section of an ion-implanted device in accordance with an embodiment of this invention. The figure shows a portion 50 of a gadolmium gallium garnet (GGG) substrate with an illustrative Yttrium Samarium Lutecium Calcium Germanium garnet host layer 51. Layer 51 has a top surface 52. During processing a pattern of photo resist 53 defines a patterned layer 54 of ion-implanted regions when exposed to irradiation by Hydrogen ions and Neon ions in succession. A succession of irradiation exposures is employed to produce a preferred damage profile in a manner well understood in the art. Thereafter, pattern 53 is removed and the entire surface 52 is exposed to Neon ions at a lesser energy level as indicated in the figure. Uniform layer 55 results. Region 56 which is a nonimplanted portion of layer 54 is referred to herein as a nonimplanted region even though a portion of the uniform layer overlies the region.

In FIG. 2 each of regions 42 and 43 corresponds to region 54 of FIG. 3. Region 44, on the other hand, corresponds to region 56 of FIG. 3. Layer 55 overlies all the regions of the patterned implanted layer. Of course, the uniform layer may be subterranean rather than at the surface 52 of layer 11. A subterranean implant layer is represented by broken line 60 and may be contiguous or separated from region 54 of the patterned implant. The preferred embodiment herein employs a shallow uniform implant and a contiguous patterned implant.

It is to be noticed in FIG. 2 that conductor 27 overlies nonimplanted region 44 as well as implanted regions 42 and 43. It is also important in the preferred embodiment that the cusp of the ion-implanted pattern be aligned with an axis of symmetry of the (crystalline) host layer. Specifically, arrows 70, 71, and 72 of FIG. 2 indicate axes of symmetry, 120 degrees apart, due to cubic anisotropy typically present in the host layer. The alignment of a cusp of the ion-implanted pattern with one of the axes allows a low generator current to be achieved and allows for relatively low drive power for the propagation operation.

Although the low drive power is highly desirable, spurious bubble generation occurs as was mentioned hereinbefore. The additional uniform ion implant layer herein raises the nucleation threshold in the host layer in a highly controlled manner. This degree of control might be compared, for example, to that achieved by rotating the ion implant pattern with respect to the axis of symmetry to increase the nucleation threshold. But ion implant pattern (as do permalloy patterns) moves bubbles in four directions in the plane of the host layer and the host layer has a three-fold symmetry. Any such rotation of the ion implant pattern to change the nucleation threshold would tend to result in different thresholds in various portions of the memory. This is especially undesirable for the two propagation directions of a minor loop.

In operation of the generator of FIG. 2, source 28 of FIG. 1 applies a pulse 80 (FIG. 2) to conductor 27 when the rotating field (from 14 of FIG. 1) is aligned in the one 1 position. As a result, a bubble 82 is generated at the cusp (90 of FIG. 2) associated with the conductor (27) as shown in FIG. 2. The rotating field next rotates counterclockwise to the two 2 position, the bubble remaining essentially still. The bubble moves to positions designated 3 and 4 in FIG. 2 as the rotating field rotates further into the three 3 and four 4 positions as shown by the encircled arrows in FIG. 2. When the generated bubble is moved to position 4, the cusp (90) at the generator is clear of data and one cycle of operation is complete. The circuit is now ready for the next cycle of operation.

It has been stated hereinbefore that alignment of the ion implant pattern with an axis of symmetry of the host layer leads to a desirably low nucleation threshold. A uniform ion implant layer, as has been stated, leads to an increase in the nucleation threshold but in a highly controlled fashion. The uniform layer also allows design flexibility and insures that nucleation will not occur when conductors cross propagation paths. The following table shows the relationship between a uniform implant and the associated nucleation threshold.

TABLE

|  | | | | 80/Ne/1E14 | | | | |
|---|---|---|---|---|---|---|---|---|
|  | | | | Collapse Field Before | Bias Field Oersteds | | | |
|  | Chip No. | Epi Thickness Microns | Strip Width Microns | Implant Oersteds | 240 | 247.5 | 255 | 262.5 |
|  | | | | | Generator Current (min) milliamps | | | |
| Uniform | 1 | 1.93 | 1.82 | 273 | . | 50 | 54 | 60 |
| Shallow | 2 | 1.79 | 1.68 | 263 | 22 | 30 | 35 | 40 |
| Implant | 3 | 1.70 | 1.64 | 262 | 46 | 50 | 54 | 60 |
| No | 4 | 1.99 | 1.74 | 277 | | Self nucleates | | |
| Uniform | 5 | 1.76 | 1.64 | 271 | | Self nucleates | | |
| Implant | 6 | 1.69 | 1.65 | 265 | | Self nucleates | | |

It is clear then that in ion-implanted bubble memories, it is necessary to insure that bubble nucleation is not spontaneous, for then propagation effectively ceases. Also it is important that the current threshold be raised comfortably above that which would lead to spurious nucleation where the conductors for control functions other than generation must cross the edge of the implanted pattern. Without these benefits of a uniform implant, complete functional operation is not likely to be achieved.

I claim:

1. A magnetic bubble memory including
a magnetic host layer in which bubbles can be moved and a means for moving bubbles in said host layer,
said memory being characterized by first and second ion-implanted layers in first and second planes respectively said first layer being uniform and for the purpose of suppressing hard bubbles and said second layer being patterned.

2. A magnetic bubble memory in accordance with claim 1 wherein said host layer is characterized by at least one axis of symmetry in the plane thereof.

3. A magnetic bubble memory in accordance with claim 2 wherein said pattern of ion-implanted regions is repetitive and has cusps aligned with said axis of symmetry.

4. A magnetic bubble memory in accordance with claim 3 wherein said first layer and second layers are uniform and patterned respectively, said first layer being a shallow surface layer and said second layer being subterranean.

5. A magnetic bubble memory in accordance with claim 4 characterized in that said first and said second layers are contiguous.

6. A magnetic memory in accordance with claim 1 wherein said second layer includes first and second ion-implanted regions separated by a third nonimplanted region at a generator position and an electrical conductor overlying said first, second and third regions.

7. A magnetic memory in accordance with claim 6 wherein said host layer has at least one axis of symmetry and said patterned second layer includes at least a cusp at said generator position aligned with said axis.

8. A magnetic memory including a host layer of material in which magnetic domains can be moved, a periodic pattern of ion-implanted regions in said layer adapted for moving domains in said layer in response to a varying magnetic field, said host layer including an ion-implanted layer of uniform thickness in addition to said periodic pattern, said implanted layer extending over at least an area large with respect to the period of said periodic pattern and for the purpose of suppressing hard bubbles.

* * * * *